(12) United States Patent
Hashimoto

(10) Patent No.: US 8,227,914 B2
(45) Date of Patent: Jul. 24, 2012

(54) MOUNTING STRUCTURE OF ELECTRONIC COMPONENT

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 397 days.

(21) Appl. No.: 12/235,956

(22) Filed: Sep. 23, 2008

(65) Prior Publication Data

US 2009/0115055 A1 May 7, 2009

(30) Foreign Application Priority Data

Nov. 2, 2007 (JP) ................................. 2007-286403

(51) Int. Cl.
*H01L 23/48* (2006.01)

(52) U.S. Cl. ... 257/737; 257/753; 257/777; 257/E23.02; 438/613

(58) Field of Classification Search .................. 438/119, 438/613; 257/777, E23.02, 737
See application file for complete search history.

(56) References Cited

U.S. PATENT DOCUMENTS

| | | | | |
|---|---|---|---|---|
| 5,508,228 A * | 4/1996 | Nolan et al. | .................. | 438/614 |
| 5,783,465 A * | 7/1998 | Canning et al. | ............... | 438/119 |
| 5,907,785 A * | 5/1999 | Palagonia | ..................... | 438/613 |
| 6,583,512 B2 * | 6/2003 | Nakaoka et al. | ............. | 257/777 |
| 6,819,191 B2 | 11/2004 | Funahara et al. | ............... | 331/68 |
| 7,470,986 B2 | 12/2008 | Kaneko | .......................... | 257/753 |
| 7,977,788 B2 * | 7/2011 | Chang et al. | .................. | 257/737 |

FOREIGN PATENT DOCUMENTS

| | | |
|---|---|---|
| JP | 53-021569 | 2/1978 |
| JP | 11-031884 | 2/1999 |
| JP | 2001-177345 | 6/2001 |
| JP | 2001-189337 | 7/2001 |
| JP | 2001-217281 | 8/2001 |
| JP | 2002-261407 | 9/2002 |
| JP | 2005-101527 | 4/2005 |
| JP | 2007-048801 | 2/2007 |

\* cited by examiner

*Primary Examiner* — Matthew E Warren
*Assistant Examiner* — Fang-Xing Jiang
(74) *Attorney, Agent, or Firm* — Harness, Dickey & Pierce, P.L.C.

(57) ABSTRACT

A mounting structure of an electronic component includes: a substrate having a terminal and the electronic component which is mounted on the substrate; and a bump electrode included in the electronic component. This bump electrode has an underlying resin provided on an active surface of the electronic component, and a conductive film covering part of a surface of the underlying resin and exposing the rest so as to be electrically continued to an electrode terminal. In this mounting structure, the conductive film of the bump electrode makes direct conductive contact with the terminal, and the underlying resin of the bump electrode elastically deforms so that at least part of an exposed area which is exposed without being covered by the conductive film directly adheres to the substrate. Further, the substrate and the electronic component retain a state of the bump electrode making conductive contact with the terminal by adhesivity of the exposed area of the underlying resin to the substrate.

9 Claims, 11 Drawing Sheets

MOUNTING STRUCTURE OF ELECTRONIC COMPONENT

BACKGROUND

1. Technical Field

The present invention relates to a mounting structure of an electronic component.

2. Related Art

Mounting techniques are used in mounting, on a substrate, electronic components such as semiconductor integrated circuit, when manufacturing liquid crystal devices and a circuit substrate mounted on various electronic apparatuses. A liquid crystal display device, for instance, includes an integrated circuit (IC) chip for liquid crystal drive so as to drive the liquid crystal panel. This IC chip for liquid crystal drive may also be mounted directly on a glass substrate that constitutes the liquid crystal panel, or, may be mounted on a flexible substrate (FPC) which is mounted on the liquid crystal panel. A mounting structure mounted by the former technique is called a chip on glass (COG) structure, and a mounting structure mounted by the latter is called a chip on flexible print circuit (COF) structure. In addition to these mounting structures, a chip on board (COB) structure is known. In this structure, an IC chip is mounted on, for instance, a glass-epoxy substrate.

Substrates and electronic components used for such mounting structures respectively include lands (terminals) coupled to a wiring pattern and bump electrodes for obtaining electric connection. Mounting structures of electronic components are formed by mounting electronic components on the substrates in a state in which the lands are coupled to the bump electrodes.

It has been desired that, in those mounting structures, electronic components be firmly and securely coupled to substrates. Particularly, in the case where there are pluralities of lands and bump electrodes and those lands are coupled to the bump electrodes, it is important that all the lands and bumps are coupled in a preferable manner so as to ensure reliability.

However, since lands and bump electrodes are generally formed with metal, a mispositioning during bonding and a misalignment caused by a low aligning precision of lands and bump electrodes could result in a contact defect (conductive defect) originating from insufficient bonding strength between these lands and bump electrodes.

Moreover, there has been a possibility that a warping of electronic components such as substrates and ICs as well as a fluctuation in setting the height of lands and bump electrodes causes a fluctuation in distance between lands and bump electrodes. This could result in an inability to obtain sufficient bonding strength between the bump electrodes and the terminals, causing a contact defect (conductive defect).

In order to prevent such disadvantages, there has been provided a print circuit board that includes: a conductive pattern having a trapezoid sectional surface; a metal conductive layer formed thereon; and multiple concavities and convexities applied on a surface of this metal conductive layer (refer to JP-A-2002-261407 for an example).

Such a print circuit board is said to provide improved mounting yield, due to the anchoring effect originating from the concavities and convexities on the metal conductive surface. The anchoring effect prevents connecting electrodes of a component (electronic component) from slipping, sliding, and getting inclined on electrodes on the substrate, when pressure is applied during component mounting.

However, while the slipping, the sliding, and the inclination of connecting electrodes (bump electrode) arranged over the metal conductive layer are prevented by the anchor effect that originates from the concavities and convexities of the metal conductive surface, the above-mentioned print circuit board does not have a structure that increases the bonding strength between the metal conductive substrate and the connecting electrode. Further, the structure does not increase the bonding strength of the pluralities of electrodes. Consequently, occurrences of mispositioning during bonding and misalignment of electrodes (lands and bump electrodes) caused by low aligning precision thereof may still result in a contact defect (conductive defect) originating from insufficient bonding strength of these electrodes. Moreover, the connecting electrodes (bump electrodes) are formed with metal, and therefore exhibit plastic deformation upon coupling. This means that, if the distance between the lands and the electrodes were uneven as described above, the connecting electrodes would have a low capability in absorbing the distance deviation by the elastic deformation, and therefore the bonding strength between these electrodes would be insufficient. For this reason, the contact defect (conductive defect) may still occur as well.

Adhesives such as underfills are required to mount and fix components on print circuit boards in a bonding (mounting) structure of print circuit board that includes such a metal conductive layer and a component that includes a connecting electrode, which is one of the causes that inhibits the cost reduction of mounting.

SUMMARY

An advantage of the invention is to provide a mounting structure of an electronic component that exhibits improved bonding strength between a bump electrode and a terminal on a substrate, as well as an improved reliability of a conductive connection, while allowing for the cost reduction for mounting.

According to an aspect of the invention, a mounting structure of an electronic component includes: a substrate having a terminal and the electronic component which is mounted on the substrate; and a bump electrode included in the electronic component. This bump electrode has an underlying resin provided on an active surface of the electronic component, and a conductive film covering part of a surface of the underlying resin and exposing the rest so as to be electrically continued to an electrode terminal. In this mounting structure, the conductive film of the bump electrode makes direct conductive contact with the terminal, and the underlying resin of the bump electrode elastically deforms so that at least part of an exposed area which is exposed without being covered by the conductive film directly adheres to the substrate. Further, the substrate and the electronic component retain a state of the bump electrode making conductive contact with the terminal by adhesivity of the exposed area of the underlying resin to the substrate.

According to this mounting structure of an electronic component, the bump electrode includes the underlying resin and the conductive film covering part of the surface of the underlying resin. A pressure applied on the terminal on the substrate easily presses the bump electrode and yields an elastically (compressively) deformed state of the underlying resin. Elastic restoring force (repelling force) increases the bonding strength between the bump electrode and the terminal, the elastic restoring force being generated in the bump electrode against the terminal of the substrate due to the elastic deformation of the internal resin in the bump electrode, thereby improving the reliability of a conductive connection.

The underlying resin elastically deforming in a state of at least part of the exposed area directly adhering to the substrate as described retains the state in which the bump electrode makes direct conductive contact with the terminal by the adhesivity of this exposed area to the substrate. This eliminates the necessity to dispose adhesives such as underfills between the substrate and the electronic component. Consequently, this allows for reducing a cost of materials for adhesives such as underfills, as well as a production cost due to the elimination of a process of disposing such adhesives, thereby resulting in a reduction in a cost for mounting.

In this case, the bump electrode and the terminal may be provided in plurality so as to include at least two bump electrodes and at least two terminals, each of the at least two bump electrodes corresponding to one of the at least two terminals so as to be bonded together. Moreover, the at least two terminals may each have a top surface with a different height so as to be bonded to the at least two bump electrodes, and the at least two bump electrodes may be bonded to the at least two terminals in a state in which a height fluctuation of the at least two terminals is absorbed by the underlying resin elastically deforming in proportion with the height of each of the at least two terminals to be bonded.

If the terminal is formed on the substrate in plurality, the top surfaces (bonding surface) of the terminals may fluctuate in height (level), due to causes such as: concaves and convexes or warping of the substrate; and process variation in the manufacturing of terminals. This causes the top surfaces of the plurality of terminals to have different distances relative to the bump electrodes.

Moreover, when coupling the substrate and the electronic component through the pluralities of bump electrodes and terminals, the substrate including terminals with uneven heights and the electronic component including bump electrodes, a fluctuation in the distance from the bump electrodes to the terminals prior to their bonding makes it difficult to couple all the bump electrodes and all the terminals in a preferable strength.

However, in the mounting structure, the degree of elastic deformation of the bump electrodes varies in proportion with the heights of the terminals to be bonded, in other words, in proportion with the distances from the bump electrodes to the top surfaces of the terminals. Therefore, the elastic deformation of the bump electrodes absorbs the fluctuation of distance between the bump electrodes and the terminals. The bump electrodes are bonded to the terminals in a state in which the height fluctuation of terminals is absorbed. Thus, even with the terminals having uneven heights (levels), the substrate and the electronic component form a preferable conductive connection through these terminals and bump electrodes. Consequently, this mounting structure improves the reliability of the conductive connection at each contact point (coupling area), as well as the strength in mounting the electronic component to the substrate.

Forming wirings and the like inside substrates has been avoided in common substrate designing, since this produces steps on the substrate surface, causing the height fluctuation of terminals. However, in this mounting structure, it does not present a problem that the steps are present on the substrate surface, since the height fluctuation of the terminals is absorbed as described, thereby increasing freedom in substrate designing.

In this case, the bump electrode and the terminal may be provided in plurality so as to include at least two bump electrodes and at least two terminals, each of the at least two bump electrodes corresponding to one of the at least two terminals so as to be bonded together. Moreover, the at least two bump electrodes may each have a bonding area with a different height so as to be bonded to the at least two terminals, and the at least two bump electrodes may be bonded to the at least two terminals in a state in which a height fluctuation of the bonding area is absorbed by the underlying resin elastically deforming in proportion with the height of the bonding area.

If the bump electrode is formed on the electronic component in plurality, the bonding areas of the bump electrodes that are bonded to the terminals may fluctuate in height (level), due to causes such as: concaves and convexes or warping of a surface of the electronic component for forming the bump electrodes; and process variation in the manufacturing of bump electrodes. This causes the bonding areas of the bump electrodes with height fluctuation to have different distances relative to the terminals.

Moreover, when coupling the electronic component and the substrate at the pluralities of bump electrodes and terminals, the electronic component including the bump electrodes with uneven height and the substrate including terminals, a fluctuation in the distance between the bump electrodes and the terminals prior to their bonding makes it difficult to couple every bump electrode to a corresponding terminal in a preferable strength.

However, in this mounting structure, the degree of elastic deformation of the bump electrodes varies in proportion with the heights of the bonding areas, in other words, in proportion with the distances from the bonding areas to the terminals. Therefore, the elastic deformation of the bump electrodes absorbs the fluctuation in the distance between the bump electrodes and the terminals. The bump electrodes are bonded to the terminals in a state in which the height fluctuation at the bonding areas is absorbed. Thus, even with the bump electrodes having uneven heights (levels), the substrate and the electronic component form a preferable conductive connection. Consequently, this mounting structure improves the reliability of the conductive connection at each contact point (coupling area), as well as the strength in mounting the electronic component to the substrate.

In common designing of electronic components, a surface for forming the bump electrodes has been designed as a planer surface without steps, so as not to cause the height fluctuation in the bump electrodes. However, in this mounting structure, it does not present a problem that the steps are present on the surface for forming the bump electrodes, since the height fluctuation of the bump electrodes is absorbed as described, thereby increasing freedom in designing electronic components.

In this case, the underlying resin may be formed approximately like a barrel vault with a transverse sectional surface of one of approximately a half circle, approximately a half oval, and approximately a trapezoid. Moreover, the conductive film may be provided in a belt-like shape on part of a top surface of the underlying resin along a direction of the transverse sectional surface.

This makes the manufacturing easier, since the plurality of bump electrodes is formed by providing the plurality of conductive films with intervals on the top surface of the underlying resin.

In this case, the electrode terminal may be installed on the electronic component, and the underlying resin may be formed to surround the electronic component.

This allows for increasing an area size of the conductive film on the underlying resin, and assuring an area of contact with the terminals to be sufficiently large allows an improvement in the reliability of electric connection.

It is preferable that the conductive film be electrically continued to the electrode terminal, and be provided in an inner area on the underlying resin in a state of surrounding the electrode terminal.

Here, the exposed area of the underlying resin is formed outside the conductive film so as to surround the conductive film. This exposed area is thus directly bonded with the substrate in, for instance, a ring surrounding the conductive film, the conductive contact state between the conductive film and the terminal is retained in a preferable manner.

In this case, the conductive film may include an area covering the underlying resin being formed with a plurality of extending pieces extending radially with the electrode terminal as a center.

This distributes stress across the extending pieces provided on the underlying resin when applying pressure to the extending pieces in a state of being bonded to the terminal, thereby preventing cracks and delamination of the conductive film.

In this case, the underlying resin may be provided so as to cover approximately an entire active surface of the electronic component, except for an area that corresponds to the electrode terminal.

This allows for the increase of an area size of the exposed area in the underlying resin, thereby increasing the adhesivity of the electronic component to the substrate.

In this case, the electronic component may be a quartz crystal resonator.

When the quartz crystal resonator is applied as the electronic component, setting the bump electrode at the node (contact point) of this quartz crystal resonator assures the quartz crystal resonator to be securely fixed at this node to the substrate.

In this case, the electronic component may be a semiconductor device.

When the semiconductor device is applied as the electronic component, coupling the semiconductor device to the substrate with the underlying resin therebetween allows the reduction of stress transmitted to the semiconductor device.

BRIEF DESCRIPTION OF THE DRAWINGS

The invention will be described with reference to the accompanying drawings, wherein like numbers reference like elements.

DESCRIPTION OF EXEMPLARY EMBODIMENTS

A mounting structure of an electronic component according to an aspect of the present invention will now be described in detail.

Figure 1:
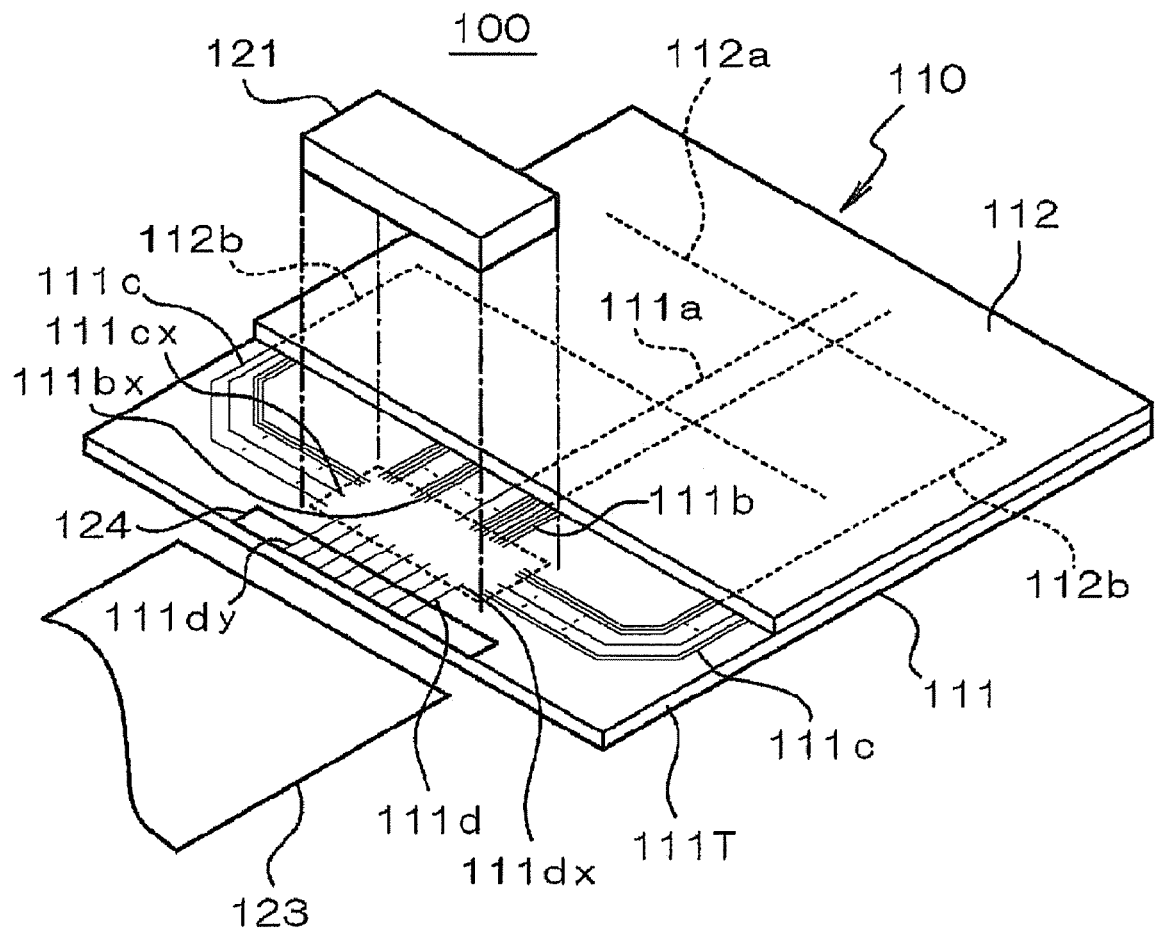
FIG. 1 is a schematic perspective view illustrating a structure of a liquid crystal device in which aspects of the invention are applied.

FIG. 1 is a schematic drawing illustrating a liquid crystal device in which the mounting structure of an electronic component according to an aspect of the invention is applied. One application of the mounting structure of an electronic component will be described with reference to FIG. 1.

The number 100 in FIG. 1 indicates a liquid crystal device, and the liquid crystal device 100 is formed including a liquid crystal panel 110 and an electronic component (IC chip for liquid crystal drive) 121. Un-illustrated supplementary members such as a polarizing plate, a refection sheet, and backlight are optionally provided to the liquid crystal device 100 as needed.

The liquid crystal panel 110 is formed including substrates 111 and 112 made of glass or synthesized resin. The substrate 111 and the substrate 112 are arranged to face each other, and are adhesively bonded together by a material such as an un-illustrated sealer. Un-illustrated liquid crystal, which is the electro-optical material, is sealed between the substrate 111 and the substrate 112. An electrode 111a made from a transparent conductive material such as indium tin oxide (ITO) is formed on an inner surface of the substrate 111, and an electrode 112a is formed on an inner surface of the substrate 112, so as to face the electrode 111a.

The electrode 111a is coupled with a wiring 111b formed with the same material as an integral unit, and is pulled out onto an inner surface of a substrate protrusion 111T provided to the substrate 111. The substrate protrusion 111T is a part that extends outward from an outline of the substrate 112 at the edge of the substrate 111. One end of the wiring 111b becomes terminals 111bx. The electrode 112a is coupled with a wiring 112b formed with the same material as that of the electrode 112a as an integral unit, and forms a conductive connection with a wiring 111c of the substrate 111 through a top-down electrical continuity unit. This wiring 111c is also formed with ITO. The wiring 111c is pulled out onto the substrate protrusion 111T, and one end of the wiring 111c becomes terminals 111cx. An input wiring 111d is formed in the vicinity of an end edge of the substrate protrusion 111T, and one end of the input wiring 111d becomes terminals 111dx. The terminals 111dx are arranged to face the terminals 111bx and the terminals 111cx. Moreover, the other end of the input wiring 111d becomes input terminals 111dy.

The electronic component 121 according to the aspect of the invention is directly mounted on the substrate protrusion 111T, without non-conductive past (NCP) and non-conductive film (NCF) interposed therebetween. The electronic component 121 is, for instance, an IC chip for liquid crystal drive that drives the liquid crystal panel 110. Un-illustrated multiple bump electrodes according to the aspect of the invention are formed on a lower surface of the electronic component 121, and these bump electrodes form conductive connections with the terminals 111bx, 111cx, and 111dx on the substrate protrusion 111T. The mounting structure according to the aspect of the invention is thereby formed, having the electronic component 121 mounted on the substrate 111.

A flexible wiring substrate 123 is mounted on an array area of the input terminals 111*dy* on the substrate protrusion 111T with an anisotropic conductive film 124 imposed between the array area and the flexible wiring substrate 123. The input terminals 111*dy* respectively have conductive connections with un-illustrated corresponding wirings that are provided to the flexible wiring substrate 123. The input terminals 111*dy* are supplied with control signals, imaging signals, and power potentials from an external source through this flexible wiring substrate 123. The control signals, imaging signals, and power potentials supplied to the input terminals 111*dy* are input into the electronic component 121 in which the drive signals for driving liquid crystal are generated so as to be supplied to the liquid crystal panel 110. It is common and preferable that the flexible substrate be a flexible organic substrate formed with materials such as polyimide and liquid crystal polymer, and that circuit patterns and terminals be formed on that substrate with copper and aluminum. However, the configuration of the flexible substrate is not limited thereto. It is more preferable that the terminals be gold plated at their surface, so as to stabilize the connection resistance.

The liquid crystal device 100 with the above structure allows a light modification independently for each pixel formed in the area in which the electrodes 111*a* and 112*a* are arranged to face each other, by impressing appropriate voltages between the electrode 111*a* and the electrode 112*a* through the electronic component 121, thereby forming a desired image in a display area of the liquid crystal device 100.

Embodiments of the mounting structure of the electronic component applied to the liquid crystal device 100 according to aspect of the invention will now be described.

Figure 2A:
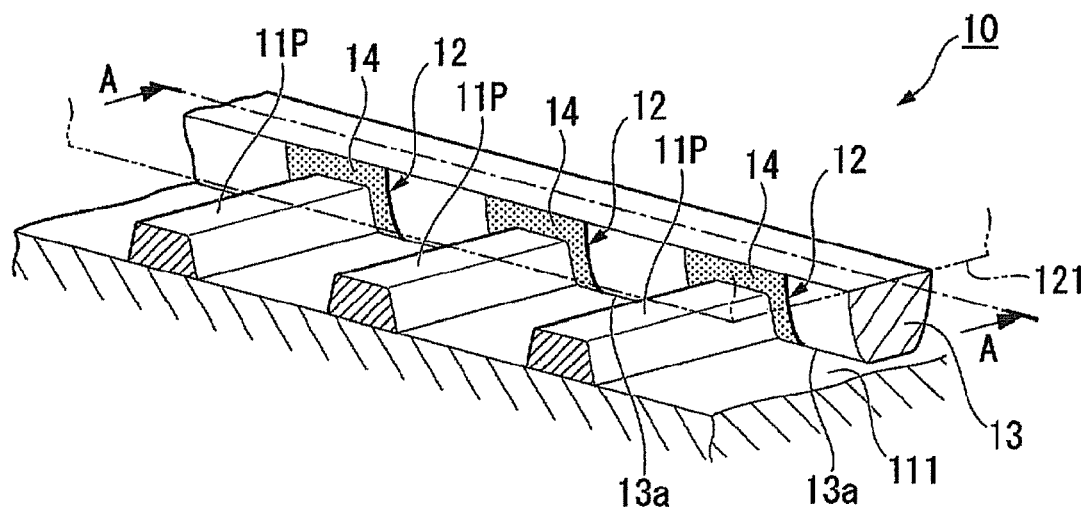
FIGS. 2A and 2B are magnified views of main parts of a mounting structure according to an embodiment of the invention.
Figure 2B:
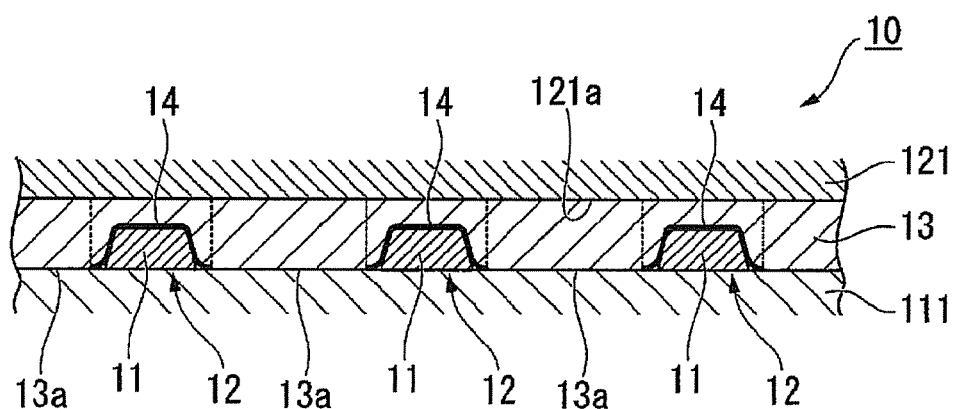

FIG. 2A is a magnified perspective view illustrating main parts of a first embodiment, which is the mounting structure of the electronic component 121 in the liquid crystal device 100. FIG. 2B is a sectional view along A-A line in FIG. 2A. 11P in FIGS. 2A and 2B indicates a wiring pattern provided on the substrate 111, and the number 11 indicates each terminal installed in the wirings, i.e. any of the above-described terminals 111*bx*, 111*cx*, and 111*dx*. In this embodiment, the terminals 11 have a relatively large film thickness, which therefore means that the height of the terminals 11 is large, with a transverse sectional surface thereof being approximately trapezoid. The number 12 indicates each bump electrode provided to the electronic component 121.

Figure 3A:
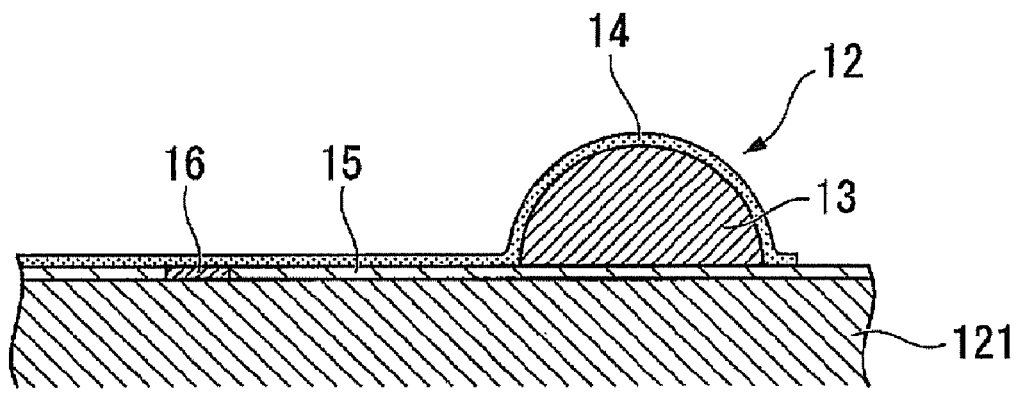
FIGS. 3A and 3B are sectional side views illustrating a schematic structure of a bump electrode.
Figure 3B:
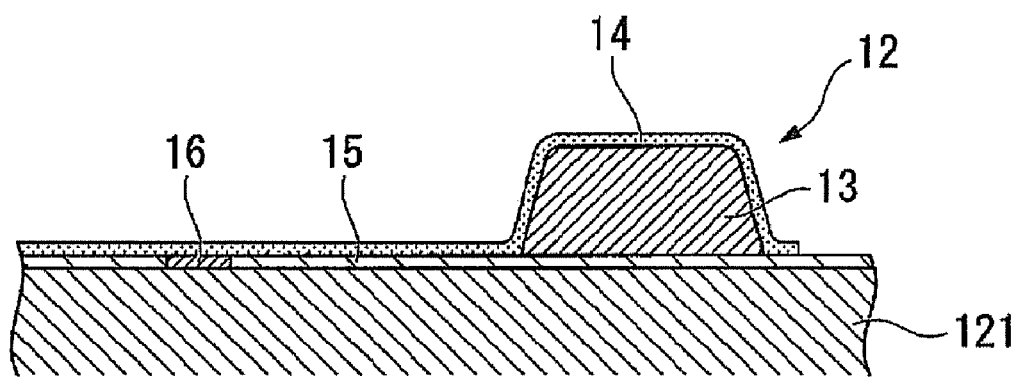

In these embodiments, as illustrated in FIG. 2A and sectional views of FIGS. 3A and 3B, each of the bump electrodes 12 has underlying resin 13 and a conductive film 14. The underlying resin 13 is shaped approximately like a barrel vault provided on an active surface 121*a* of the electronic component 121, and the conductive film 14 covers part of the surface of the underlying resin 13 and expose the rest. Areas which are exposed and not covered by the conductive film 14 in the underlying resin 13 are exposed areas 13*a* according to the aspect of the invention.

The conductive film 14 is, as shown in FIGS. 3A and 3B, coupled to and electrically continued to an electrode terminal 16 which is exposed out of an opening of an insulating film 15 at a surface of the electronic component 121 so as to be lead onto the underlying resin 13. The conductive film 14 covering the surface of the underlying resin 13 in such a structure is electrically continued to the electrode terminal 16, thereby substantially functioning as an electrode of the electronic component 121. In these embodiments, the conductive film 14 is provided in plurality on the surface of the underlying resin 13 as shown in FIG. 2A, and each of these conductive films 14 is independently coupled and electrically continued to the electrode terminal 16 of the electronic component 121. Therefore, the conductive films 14 independently function, together with the underlying resin 13 positioned in an inner area of each of the conductive films 14, as the bump electrodes 12 according to the aspect of the invention.

Here, the aforementioned "approximately a barrel vault shape" means a columnar shape having a flat inner (bottom) surface that is in contact with the electronic component 121, as well as a curved outer surface that is not in contact therewith. Specifically, the preferably used bump electrodes 12 each have a transverse sectional surface such as approximately half circle as shown in FIG. 3A, approximately half oval (not illustrated), and approximately trapezoid as shown in FIG. 3B. Here, each of the bump electrodes 12 that has a transverse sectional surface of approximately trapezoid as shown in FIG. 3B has a curve at least at a shoulder between the top and the side in this transverse sectional surface, making the outer surface that does not contact the electronic component 121 a curved surface as described.

The underlying resin 13 has an insulating property and heat adhesiveness, exhibiting adhesiveness when the electronic component 121 is heated while pressed and compressed against the substrate 111 during the mounting of the electronic component 121 to the substrate 111. Specifically, various thermoplastic resins may be used, such as polyimide, benzocyclobutene (BCB), and liquid crystal polymer. Other examples of resin which may be used include photosensitive or thermosetting insulating resins with thermoplastic constituent. In other words, in case of using thermosetting resin such as polyimide which contains thermoplastic constituent, heat treatment is carried out for forming the bump electrodes 12, without entirely curing the underlying resin 13 so as to keep the underlying resin 13 in semi-cured state. Thereafter, after mounting the electronic component 121, a part of the electronic component 121 is heated and fully cured in a state that part of the electronic component 121 butt and be compressed to the substrate 111. The underlying resin 13 with adhesiveness in a semi-cured state adheres to the substrate 111 during the process of receiving pressure and heat so as to be cured. The underlying resin 13 is cured in that state and therefore the adhesive state is retained.

In case of using thermoplastic resins which may contain thermosetting constituent as necessary, the underlying resin 13 is fully cured at the time of forming the bump electrodes 12. Thereafter, at the time of mounting the electronic component 121, part of the underlying resin 13 is heated in a state to butt and be compressed to the substrate 111. Part of the underlying resin 13 melts and softens, exhibiting adhesiveness. Thereafter, the underlying resin 13 is cured again by cooling. This melted and softened underlying resin 13 adheres to the substrate 111 during the process of cooling and curing, and is cured in that state so as to retain the adhesive state. Forming the underlying resin 13 by using thermoplastic resins allows an easy removal of the electronic component 121 from the substrate 111 by reheating and softening the underlying resin 13, in case of defects such as a misalignment after mounting the electronic component 121 to the substrate 111 using the adhesivity of the underlying resin 13.

Such underlying resin 13 is formed, as described, approximately like a barrel vault by known techniques of lithography and etching. The material of resin (hardness) and its detailed shape (heights and widths) of the approximate barrel vault are optionally selected and designed in accordance with the shape and the size of the terminals 11.

The conductive films 14 are made of metals and alloys such as Au, TiW, Cu, Cr, Ni, Ti, W, NiV, Al, Pd, and lead-free solder, and may be either a single layer or a multilayer of these metals (alloys). Such conductive films 14 may be deposited with a known film deposition method such as sputtering and thereafter be patterned into a belt-like shape, or, may be selectively formed by electroless plating. Alternatively, an underlying film may be formed with methods such as sputtering and electroless plating, and thereafter an upper layer film may be formed thereon with electroplating, so as to form the conductive films 14 with a multilayer film composed with the underlying film and the upper layer film. Types, a layer structure, a film thickness, and width of the metal (alloy) are optionally selected and designed, similar to the case of the underlying resin 13, in accordance with the shape and the size of the terminals 11. However, it is preferable that gold (Au) that excels, in particular, in flatting property be used for the conductive films 14, since the conductive films 14 also elastically deform as the underlying resin 13 elastically deforms. Moreover, in case of forming the conductive films 14 in multilayer, it is preferable that gold be used for the outermost layer. Moreover, it is preferable that the width of the conductive films 14 be sufficiently wider than that of the terminals 11 to be bonded.

Figure 4A:
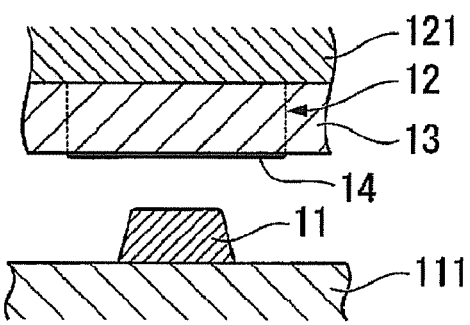
FIGS. 4A to 4D are drawings for describing the mounting structure according to the above embodiment.

FIG. 4A is a drawing illustrating a status before mounting the electronic component 121 to the substrate 111, and is a magnified sectional view corresponding to main parts of the FIG. 2B. The underlying resin 13 has adhesiveness in a semi-cured state in case of thermosetting resin, and in a fully cured state in case of thermoplastic resin.

Figure 4B:
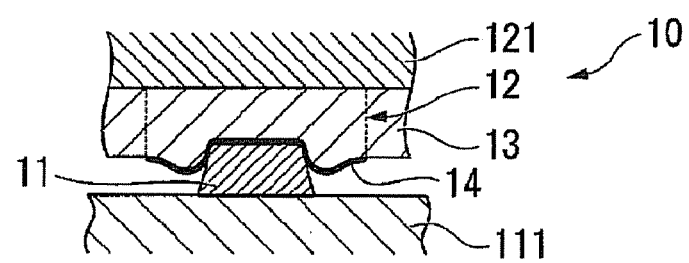
Figure 4C:
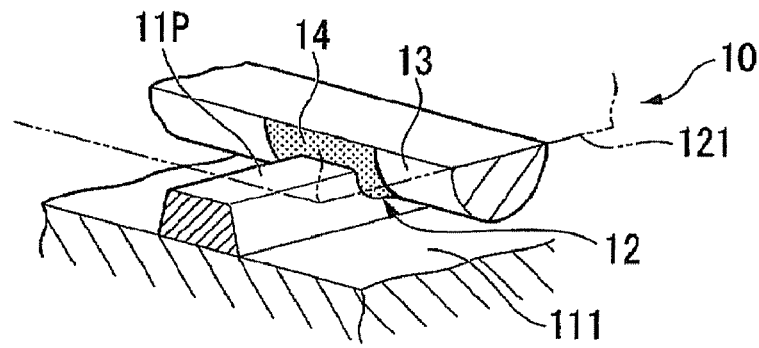

The substrate 111 and the electronic component 121 are positioned so that the terminals 11 and the bump electrodes 12 face each other. In this state, a pressure is applied in the direction to bond each other, so that the conductive films 14 of the bump electrodes 12 are bonded to the terminals 11 as shown in FIGS. 4B and 4C, so as to make conductive contact. Moreover, the heat processing is carried out concurrently with the application of pressure. The heating temperature is optionally set in accordance with attributes such as a type of the underlying resin 13.

Figure 4D:
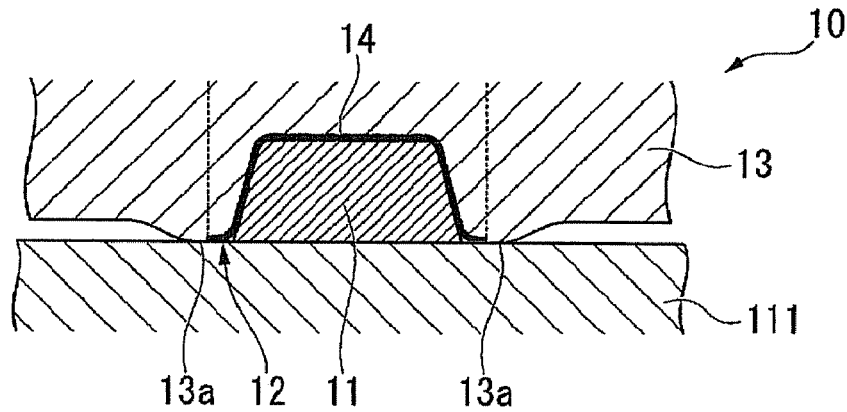

The underlying resin 13 elastically deforms further as shown in FIG. 4D, as the application pressure is increased and the bump electrodes 12 are compressed to the substrate 111 in a state the conductive films 14 making conductive contact with the terminals 11. Here, the exposed areas 13a are exposed out of the conductive films 14, and part of each of the exposed areas 13a of the underlying resin 13 then directly is bonded (adhesively bonded) to the substrate 111. Increasing the application pressure further causes the bump electrodes 12 and the exposed areas 13a of the underlying resin 13 to be directly bonded (adhesively bonded) to the substrate 111 at their entire surfaces, as shown in FIG. 2B. The exposed areas 13a of the underlying resin 13 adhere to the substrate 111 in a preferable manner by curing (fully curing) the underlying resin 13 in this state as described. The electronic component 121 is mounted on the substrate 111 by adhering the exposed areas 13a of the underlying resin 13 to the substrate 111. The state of conductive contact between the bump electrodes 12 and the terminals 11 is retained by the adhesivity of the exposed areas 13a. Consequently, a mounting structure 10 according to a first embodiment is obtained.

In the mounting structure 10 formed as described and is recited as the first embodiment of the invention, the electronic component 121 is pressed relative to the substrate 111, and the bump electrodes 12 butt the terminals 11 and are further pressed in this state, so that the underlying resin 13 of the bump electrodes 12 further elastically (compressively) deforms and the entire surfaces of the exposed areas 13a of the underlying resin 13 adhere to the substrate 111. Elastic restoring force (repelling force) increases the bonding strength between the bump electrodes 12 and the terminals 11, the elastic restoring force being generated in the bump electrodes 12 against the terminals 11 of the substrate 111 due to the elastic deformation of the underlying resin 13, thereby improving the reliability in the state of conductive connection.

The adhesivity of the exposed areas 13a in the underlying resin 13 to the substrate 111 retains the state in which the bump electrodes 12 make conductive contact with the terminals 11. This eliminates the need of filling (disposing) underfills (adhesives) such as non-conducting pastes (NCP) between the substrate 111 and the electronic component 121. Consequently, this allows for reducing a material cost for adhesives, as well as a production cost due to the elimination of a process of disposing such adhesives, and therefore a cost is reduced for mounting.

Moreover, since the exposed areas 13a positioned between the conductive films 14 directly butt the surface of the substrate 111, the internal resin 13 with insulating property prevents a current leak (migration) between the adjacent terminals 11 with the exposed areas 13a therebetween.

In the mounting structure 10 of the first embodiment, the electronic component 121 is mounted to the substrate 111 so that approximately the entire surfaces of the exposed areas 13a of the underlying resin 13 are directly bonded (adhesively bonded) to the substrate 111 as shown in FIG. 2B. However, if the adhesivity of the underlying resin 13 is sufficiently large, the underlying resin 13 may be fully cured in a state in which only part of each of the exposed areas 13a is directly bonded (adhesively bonded) to the substrate 111 as shown in FIG. 4D. The adhesivity of the exposed areas 13a retains the conductive contact state between the bump electrodes 12 and the terminals 11 in a preferable manner. This eliminates the need of filling (disposing) underfills (adhesives) between the substrate 111 and the electronic component 121.

Figure 5A:
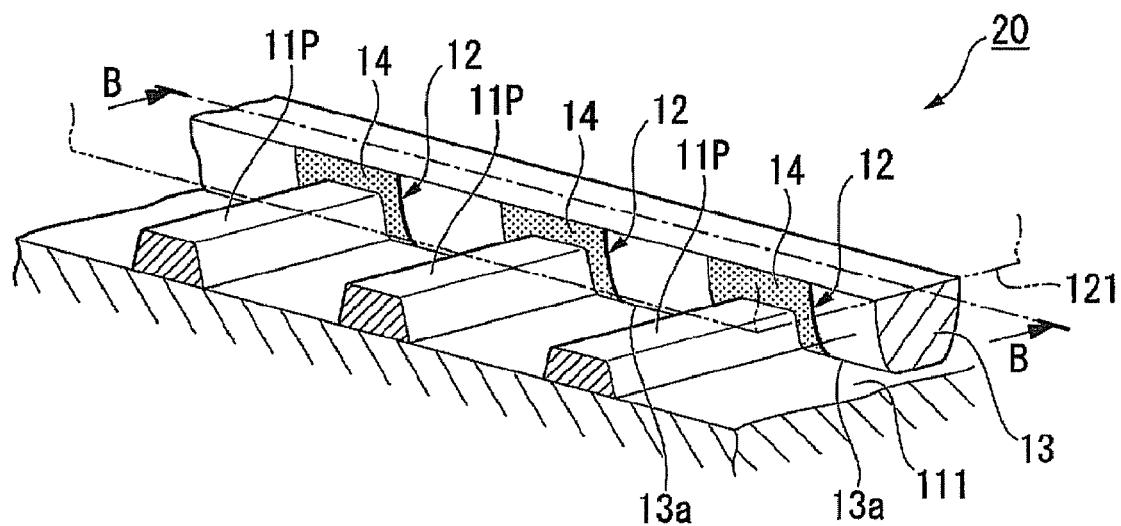
FIGS. 5A and 5B are magnified views of main parts of a mounting structure according to another embodiment of the invention.
Figure 5B:
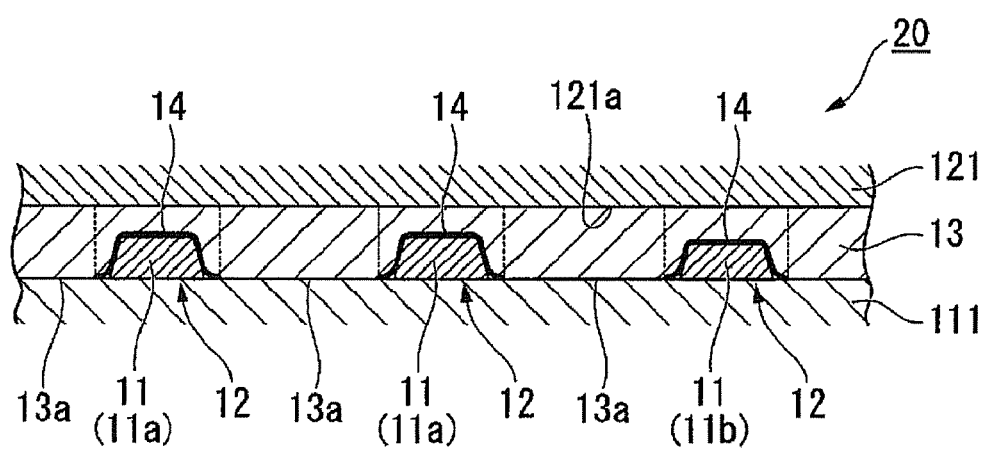

FIGS. 5A and 5B are drawings illustrating a second embodiment of the mounting structure of the electronic component according to the aspect of the invention. The number 20 indicates a mounting structure. FIG. 5A is a magnified perspective view of main parts of the mounting structure, and FIG. 5B is a sectional view along B-B line in FIG. 5A. The mounting structure 20 in the second embodiment differs from the mounting structure 10 in the first embodiment shown in FIGS. 2A and 2B in that at least two of the terminals 11 formed on the substrate 111 have different heights at the top surfaces (bonding surfaces) that are bonded to the bump electrodes 12. In other words, in the mounting structure 20 in this embodiment, the terminals 11 include at least two terminals 11, i.e. a terminal 11a and a terminal 11b with different heights. Such height difference (fluctuation) of the terminals 11 may originate either from: concaves and convexes or warping of the substrate 111; or from the process variation in the manufacturing of the terminals 11. Here, the height fluctuation of the terminals 11 according to the aspect of the invention may originate from any one of or both of the above.

Figure 6A:
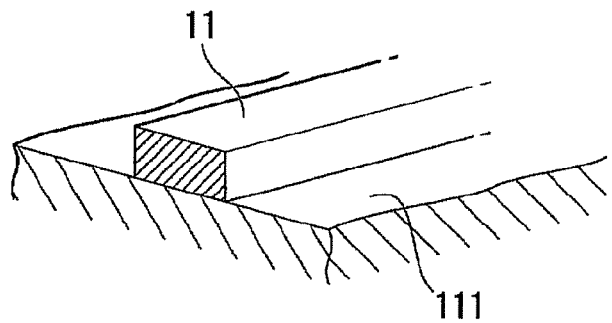
FIGS. 6A to 6C are sectional perspective views for describing shapes of a terminal.
Figure 6B:
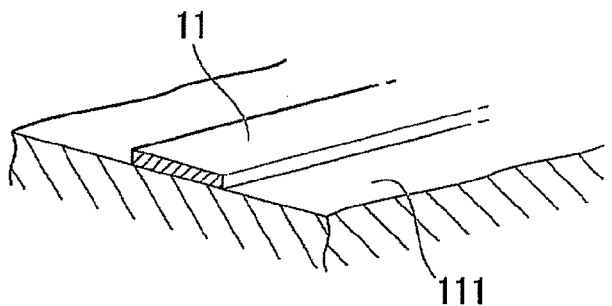
Figure 6C:
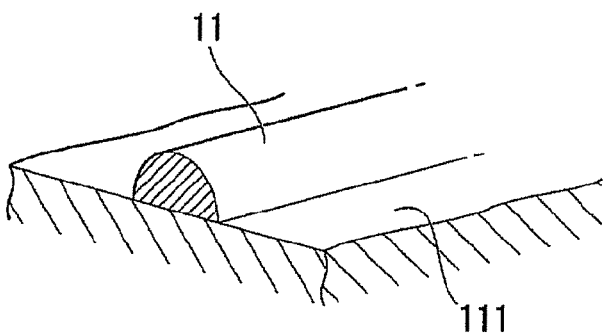

In the second embodiment shown in FIGS. 5A and 5B, the fluctuation in height of the terminals 11a and 11b originates from the process variation in the manufacturing of the terminals 11. Here, since the terminals 11 are formed with an additive process (plating deposition), they have a relatively thick film thickness, which means that the height of the terminals 11 is large, and a transverse sectional surface of the terminals 11 is approximately trapezoid. The terminals 11 may be formed in other shapes such as: one formed by etching with the transverse sectional surface being rectangular as shown in FIG. 6A; a thin film formed by sputtering as shown in FIG. 6B; and an approximately like a barrel vault formed by printing as shown in FIG. 6C.

The terminal 11a and the terminal 11b with different heights are bonded to two of the bump electrodes 12 corresponding thereto while absorbing the height fluctuation (difference) of the terminals 11a and 11b, and in this state, the exposed areas 13a of the underlying resin 13 directly adhere to the substrate 111.

Figure 7A:
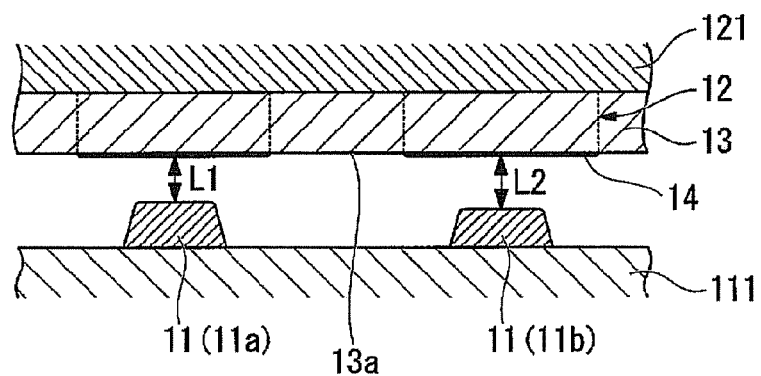
FIGS. 7A and 7B are explanatory drawings of the mounting structure according to the above embodiment.
Figure 7B:
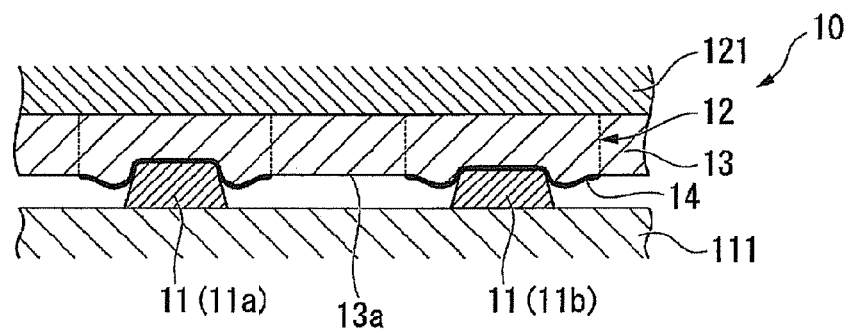

FIG. 7A is a drawing illustrating a status before mounting the electronic component 121 to the substrate 111, and is a sectional view corresponding to main parts of the FIG. 7B. The substrate 111 and the electronic component 121 are positioned so that the terminals 11a and 11b face the bump electrodes 12. At this time, due to the height fluctuation of the terminals 11a and 1ib, distances L1 and L2 from the bonding surfaces of the bump electrodes 12 to the terminals 11a and 11b differ from one another, generating a fluctuation, therefore making it difficult to couple all the bump electrodes 12 and the terminals 11 in a preferable strength.

In this state, applying pressure in the direction of bonding the electronic component 121 and the substrate 111 together as in this embodiment allows the conductive films 14 of the bump electrodes 12 to be bonded to corresponding terminals 11a and 11b as shown in FIG. 7B, thereby making conductive contact. Further increase of the application pressure causes further elastic (compressive) deformation of the underlying resin 13 of the bump electrodes 12 as shown in FIG. 7B, so that approximately the entire surfaces of the exposed areas 13a of the underlying resin 13 adhere to the substrate 111.

The underlying resin 13 elastically (compressively) deforming in proportion with the application pressure causes the bump electrodes 12 to elastically (compressively) deform proportionally to the heights of the terminals 11a and 11b being bonded. In other words, the bump electrodes 12 elastically deform in different degrees proportionally to the distances from the top surfaces of the terminals 11a and 11b to the bonding surfaces of the bump electrodes 12. Therefore, even if the height of the terminal 11a is different from that of the terminal 11b, and therefore the distances from the terminals 11a and 11b to the bump electrodes 12 are uneven, such fluctuation is absorbed by the bump electrodes 12 elastically deforming proportionally to those distances.

In other words, in this mounting structure 20, the terminals 11a and 11b form a preferable conductive connection with the bump electrodes 12 even though the terminals 11a and 11b have fluctuation in height (level). This improves the reliability of the conductive contact state at each contact point (coupling area), as well as the strength in mounting the electronic component 121 to the substrate 111.

Moreover, this allows the cost reduction for mounting, since, similar to the mounting structure 10 in the first embodiment, the state of the bump electrodes 12 making conductive contact with the terminals 11 is retained by the adhesivity of the exposed areas 13a.

Similar to the first embodiment, if the adhesivity of the underlying resin 13 is sufficiently large in the second embodiment, the underlying resin 13 may be fully cured in a state in which only part of each of the exposed areas 13a is bonded (adhesively bonded) directly to the substrate 111.

In this second embodiment, the cause of the fluctuation in height between the terminals 11a and 11b originates from the process variation in the manufacturing of the terminals 11. However, another source of this fluctuation may also originate from the designing of, for instance, elements such as wirings inside the substrate 111. The mounting structure in this case also absorbs the height fluctuation between the terminals 11a and 11b as described. Therefore, this embodiment allows for a presence of steps on a substrate surface in designing, increasing freedom in designing the substrate 111, while this has been avoided in a common substrate designing.

Figure 8:
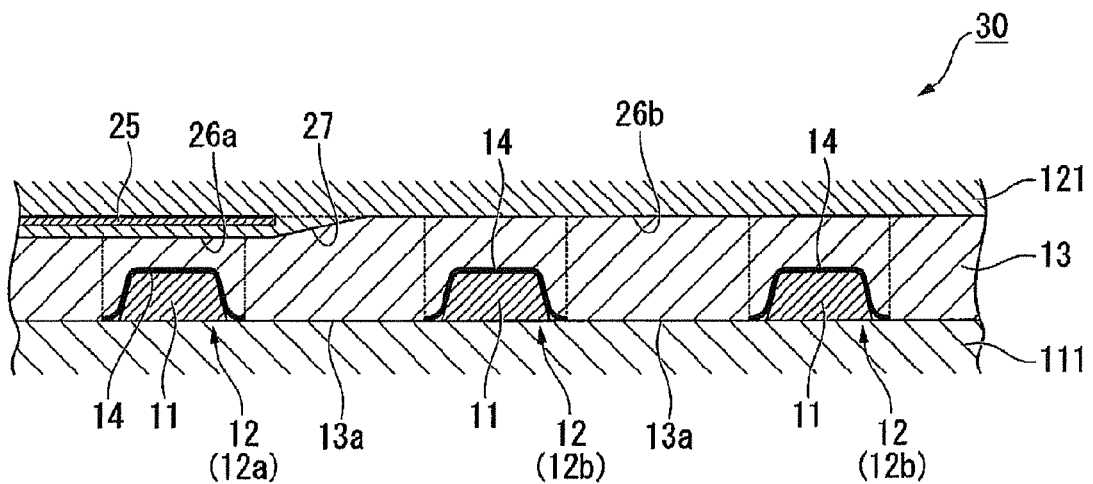
FIG. 8 is a sectional view of main parts of a mounting structure according to still another embodiment of the invention.

FIG. 8 is a sectional view of main parts illustrating a third embodiment of a mounting structure of an electronic component. The number 30 indicates a mounting structure. The mounting structure 30 in the third embodiment differs from the mounting structure 10 in the first embodiment shown in FIGS. 2A and 2B in that at least two of the bump electrodes 12 on the electronic component 121 are formed to have different heights at the bonding areas that are bonded to the terminals 11. In other words, in the mounting structure 30 of this embodiment, the bump electrodes 12 include at least two bump electrodes 12a and 12b with different heights. Such a height difference (fluctuation) of the bump electrodes 12 may originate either from the electronic component 121, i.e. from concaves and convexes or warping of a surface for forming the bump electrodes in the electronic component 121, or from the process variation in the manufacturing of the bump electrodes 12. This embodiment complies with the height fluctuation originating from at least one of the above.

In this embodiment illustrated in FIG. 8, an internal wiring 25 is formed on the surface layer of the active surface of the electronic component 121. This means that a step 27 inevitably causes a structural height fluctuation of the bump electrodes 12a and 12b in designing. Here, the step 27 is formed on the active surface of the electronic component 121, between a region 26a and a region 26b, the region 26a including the internal wiring 25 formed therein, and the region 26b without the internal wiring 25. If the bump electrodes 12 are formed on both the region 26a and the region 26b, i.e. on both sides of the step 27, then even there is no fluctuation originating from the process variation in the manufacturing of the bump electrodes 12, the concave and convex (the step 27) on the electronic component 121 results in a difference of height (level) at the top part (bonding area) of the bump electrodes 12a and 12b that are respectively formed on the regions 26a and 26b. The bump electrodes 12a and 12b have an uneven height as a result.

The bump electrodes 12a and 12b are bonded to the terminals 11 with different heights in a state of absorbing their height fluctuation (difference) at the bonding areas, and in this state, the exposed areas 13a of the underlying resin 13 directly adhere to the substrate 111.

Figure 9A:
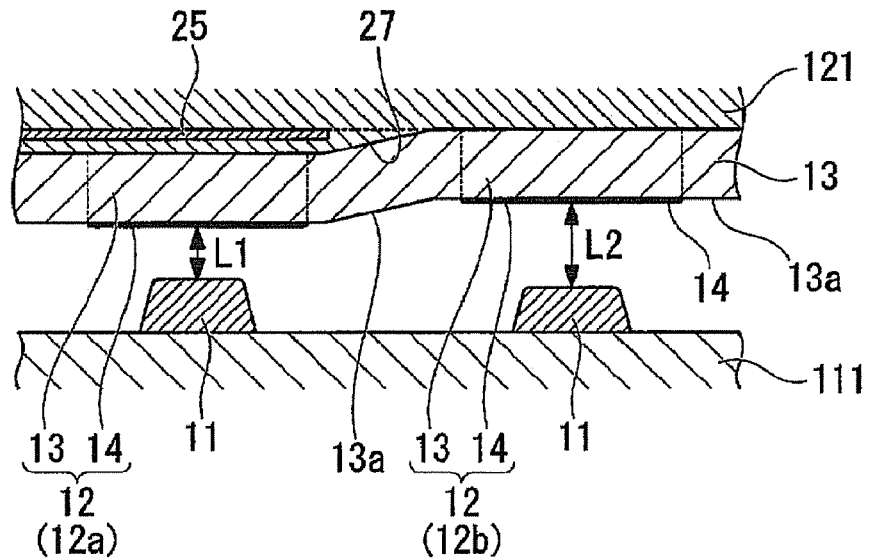
FIGS. 9A and 9B are drawings for describing the mounting structure according to the above embodiment.

FIG. 9A is a drawing illustrating a status before mounting the electronic component 121 to the substrate 111, and is a sectional view corresponding to main parts of the FIG. 8. The electronic component 121 and the substrate 111 are positioned so that the bump electrodes 12a and 12b are positioned to face the two corresponding terminals 11. At this time, due to the bump electrodes 12a and 12b having uneven height, distances L1 and L2 from the bonding areas of the bump electrodes 12a and 12b to the terminals 11 differ from one another, resulting in unevenness, therefore making it difficult to couple all the bump electrodes 12 and the terminals 11 in a preferable strength.

Figure 9B:
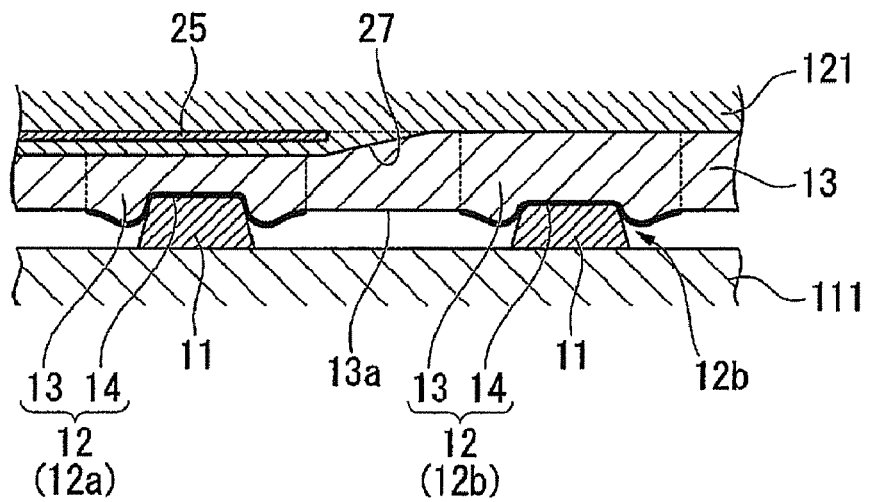

In this state, applying pressure in the direction of bonding the electronic component 121 and the substrate 111 together as in this embodiment allows the conductive films 14 of the bump electrodes 12a and 12b to be bonded to corresponding terminals 11 as show in FIG. 9B, thereby making conductive contact. Further increase of the application pressure causes further elastic (compressive) deformation of the underlying resin 13 of the bump electrodes 12 as shown in FIG. 8, so that approximately the entire surfaces of the exposed areas 13a of the underlying resin 13 adhere to the substrate 111.

The underlying resin 13 elastically (compressively) deforming in proportion with the application pressure easily causes the bump electrodes 12 to elastically (compressively) deform proportionally to the heights of the terminals 11 being bonded. In other words, the bump electrodes 12 elastically deform in different degrees proportionally to the distances from the top surfaces of the terminals 11 to the bonding surfaces of the bump electrodes 12a and 12b. Therefore, even if the height of the bump electrode 12a is different from that of the bump electrode 12b, and therefore the distances from the terminals 11 to the bump electrodes 12a and 12b are uneven, such fluctuation is absorbed by the bump electrodes 12a and 12b elastically deforming proportionally to those distances.

In other words, in this mounting structure 30, the bump electrodes 12a and 12b form a preferable conductive connection with the terminals 11 even though the bump electrodes 12a and 12b have fluctuation in height (level). This improves the reliability of the conductive contact state at each contact point (coupling area), as well as the strength in mounting the electronic component 121 to the substrate 111.

Moreover, this allows the cost reduction for mounting, since, similar to the mounting structure 10 in the first embodiment, the state of the bump electrodes 12 making conductive contact with the terminals 11 is retained by the adhesivity of the exposed areas 13a.

In common designing of electronic components, a surface for forming the bump electrodes 12 has been designed as a planer surface without steps, so as not to cause the height fluctuation in the bump electrodes 12. However, in this mounting structure 30, it does not present a problem that the steps are present on the surface for forming the bump electrodes, since the unevenness of height between the bump electrodes 12a and 12b is absorbed as described, thereby increasing freedom in designing the electronic component 121.

Similar to the first embodiment, if the adhesivity of the underlying resin 13 is sufficiently large in the third embodiment, the underlying resin 13 may be fully cured in a state in which only part of each of the exposed areas 13a is bonded (adhesively bonded) directly to the substrate 111.

Figure 10A:
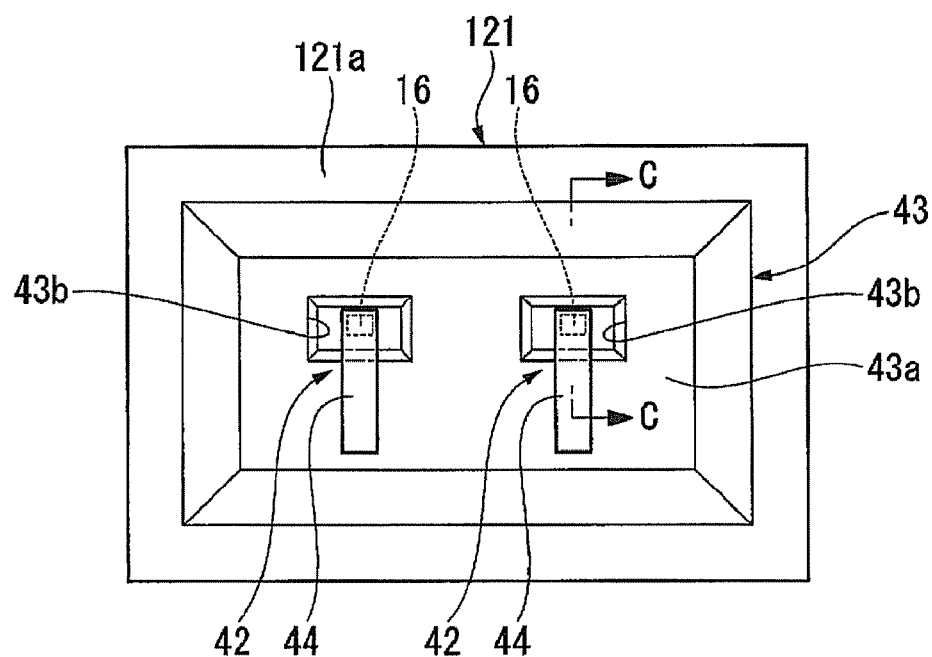
FIGS. 10A and 10B are explanatory drawings of a mounting structure according to another embodiment of the invention.
Figure 10B:
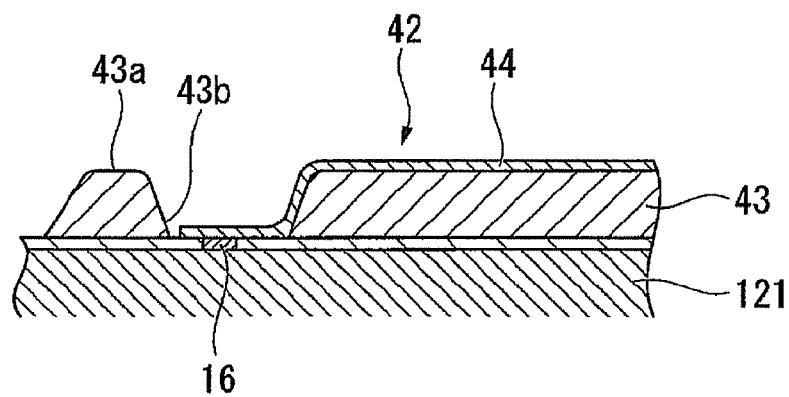

FIGS. 10A and 10B are drawings illustrating a fourth embodiment of the mounting structure of the electronic component according to the aspect of the invention. FIG. 10A is a plan view of the electronic component 121 at the active surface 121a, and FIG. 10B is a sectional view along C-C line in FIG. 10A. The mounting structure in the fourth embodiment differs from the mounting structure 10 in the first embodiment shown in FIGS. 2A and 2B in that the underlying resin of the bump electrodes is formed to surround the electrode terminal 16 provided on the active surface of the electronic component 121. The electrode terminal 16 may be provided in plurality.

In this mounting structure, underlying resin 43 of bump electrodes 42 is formed in a truncated pyramid or a square plate on the active surface 121a of the electronic component 121, and includes openings 43b at positions corresponding to the electrode terminals 16, in an inner area of the underlying resin 43. One edge of each of belt-like conductive films 44 is bonded (electrically continued) to each of the electrode terminals 16 exposed inside each of the openings 43b, and the other edge of each of the conductive films 44 is pulled out on the underlying resin 43 so as to cover part of the underlying resin 43. According to an example shown in FIG. 10A, two electrode terminals 16, respectively corresponding to the openings 43b, are arranged in the underlying resin 43. However, the underlying resin 43 may be patterned so as to form one common opening for the two electrode terminals 16. The number of the electrode terminals 16 inside the underlying resin 43 may also be, in addition to two, one or three and/or more.

The areas of the conductive films 44 covering the underlying resin 43 in FIG. 10A substantially function as the bump electrodes 42. Therefore, the underlying resin 43 in this embodiment has a sufficiently larger area relative to the underlying resin 13 which is shaped approximately like a barrel vault in the above embodiments. This allows for increasing the area size of the conductive films 44 on the underlying resin 43 compared to the above embodiments, as well as widening (enlarging) areas that substantially function as electrodes so as to ensure a sufficiently large area for coupling the bump electrodes 42 to the terminals 11 of the substrate 111, thereby improving the reliability of electric connection.

Moreover, compared to the underlying resin 13 with an approximately a barrel vault shape, the underlying resin 43 in this embodiment obtains an increased (larger) area that is not covered by the conductive films 44. This allows for increasing the area size of the underlying resin 43 that directly adheres to the substrate 111, thereby improving the strength in mounting the electronic component 121 to the substrate 111.

Figure 11:
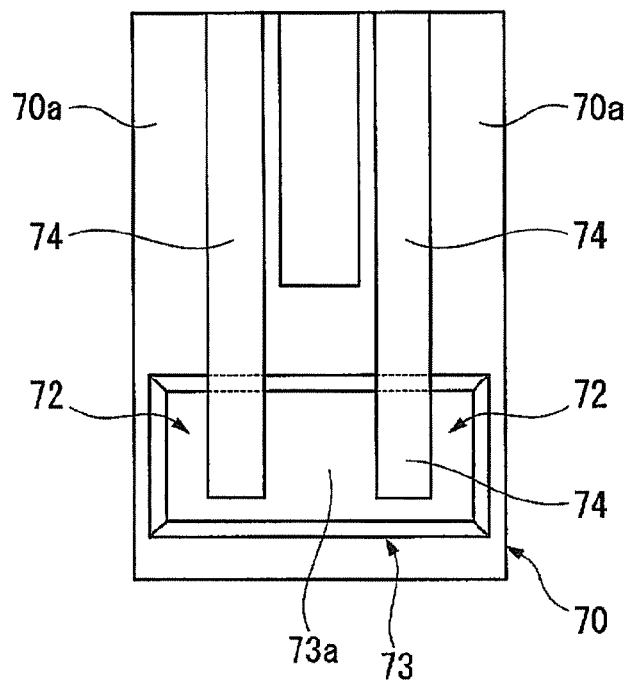
FIG. 11 is an explanatory drawing of a mounting structure according to still another embodiment of the invention.

FIG. 11 is a drawing describing a fifth embodiment of a mounting structure of an electronic component, and is a plan view of the active surface of the electronic component. The mounting structure of the fifth embodiment refers to an example of applying, in particular, a quartz crystal resonator as the electronic component.

The number 70 indicates a tuning fork quartz crystal resonator in FIG. 11. A quartz crystal resonator 70 includes a pair of resonator elements 70a which serves as an electrode terminals of the electronic component according to the aspect of the invention. Bump electrodes 72 are formed over one of the surfaces of the quartz crystal resonator 70 at its base.

The bump electrodes 72 are coupled to the surface of underlying resin 73 having a shape of rectangular plate in plan view, as well as to the surfaces of the resonator elements 70a. Moreover, the bump electrodes 72 include two belt-like conductive films 74, one end of each being lead onto the underlying resin 73 so as to cover part of the underlying resin 73. That is to say, the quartz crystal resonator 70 has two bump electrodes 72. The underlying resin 73 has a tapered side surfaces, and this prevents disconnection (step fault) of conductive films 74 at the step of the underlying resin 73 when the conductive films 74 are led onto the underlying resin 73.

The bump electrodes 72 are formed so that an exposed area 73a of the underlying resin 73 directly adheres to the substrate, and are configured to be connected to terminals on an un-illustrated substrate. The bump electrodes 72 being the nodes (contact points) of this quartz crystal resonator 70 assures the quartz crystal resonator 70 to be securely fixed to the substrate at these nodes. Therefore, in this mounting structure, the quartz crystal resonator 70 is mounted to the substrate in a preferable manner, without compromising its resonating mobility.

Figure 12:
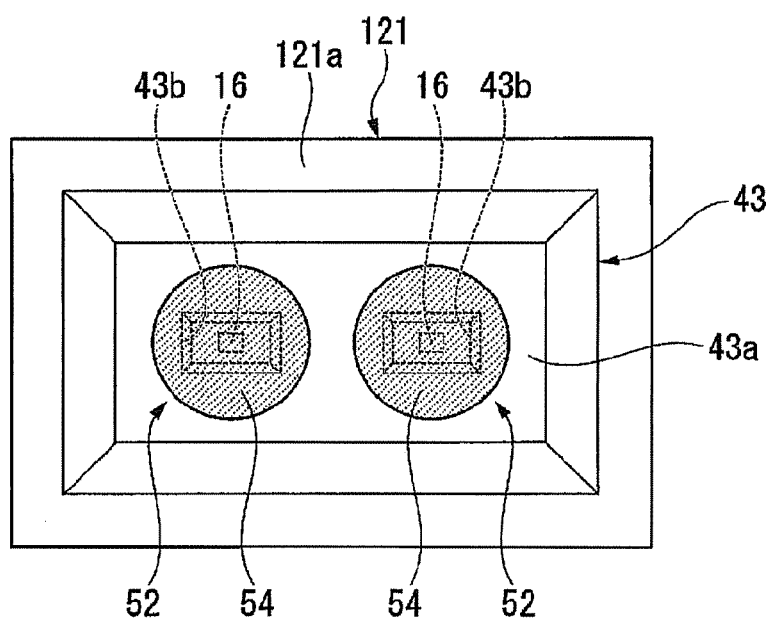
FIG. 12 is an explanatory drawing of a mounting structure according to yet another embodiment of the invention.

FIG. 12 is a drawing describing a sixth embodiment of a mounting structure of an electronic component, and is a plan view of the active surface of the electronic component. The mounting structure in the sixth embodiment differs from the mounting structure in the fourth embodiment shown in FIGS. 10A and 10B in that conductive films 54 are electrically continued to the electrode terminals 16 and are provided in an inner area of and on the underlying resin 43 so as to surround the electrode terminals 16.

The conductive films 54 of bump electrodes 52 in this mounting structure are formed in circles in plan view as shown as dotted line areas in FIG. 12, and adhere (electrically continued) to the electrode terminals 16 exposed inside the openings 43b at the centers of the conductive films 54. The peripheries of the conductive films 54 are pulled out onto the underlying resin 43 so as to cover part of the underlying resin 43, and areas that substantially function as electrodes surround the electrode terminals 16 approximately in toroid.

In these bump electrodes 52, exposed areas 43a of the underlying resin 43 are formed in the peripheries of the conductive films 54 so as to surround the conductive films 54. Therefore, by directly adhering the exposed areas 43a to the substrate 111 in a state of rings that surround the areas of the conductive films 54 that substantially function as electrodes, the conductive contact state between the conductive films 54 and the terminals 11 are retained in a preferable manner. This improves the reliability of electric connection between the bump electrodes 52 and the terminals 11.

In the embodiments shown in FIGS. 10 and 12, the shapes of the openings 43b that expose the electrode terminals 16 out of the underlying resin 43 are, but not limited to, rectangular, and may include various shapes such as circles.

Figure 13:
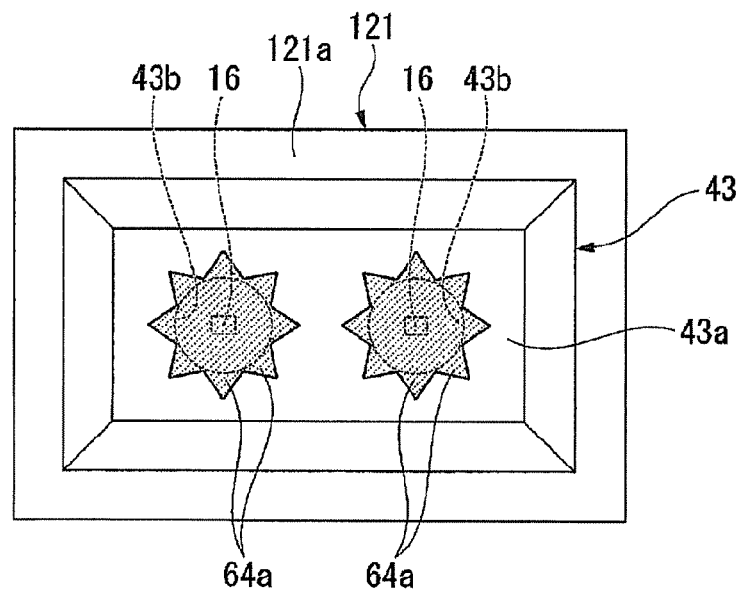
FIG. 13 is an explanatory drawing of a mounting structure according to still further embodiment of the invention.

FIG. 13 is a drawing describing a seventh embodiment of a mounting structure of an electronic component, and is a plan view of the active surface of the electronic component. In the mounting structure in the seventh embodiment, shapes of the openings 43b in the underlying resin 43 and plan view shapes of conductive films 64 are different from that of the sixth embodiment shown in FIG. 12.

In bump electrodes 62 of this mounting structure, the openings 43b in the underlying resin 43 are formed in circles with the electrode terminals 16 as a center. While central areas of the conductive films 64 adhere (electrically continued) to the electrode terminals 16 exposed inside the openings 43b as shown in dotted line areas in FIG. 13, the peripheries of the conductive films 64 i.e. areas that substantially function as electrodes are composed of a plurality of extending pieces 64a extending radially with the electrode terminals 16 as a center. Here, the peripheries of the conductive films 64 are pulled out onto the underlying resin 43 so as to cover part of the underlying resin 43.

In such bump electrodes 62, the extending pieces 64a that substantially function as electrodes on the underlying resin 43 adhere to the terminals 11. The stress caused by applying pressure in this state is distributed across the extending pieces 64a, thereby preventing cracks and delamination of the conductive films 64. This improves the reliability of electric connection between the bump electrodes 62 and the terminals 11.

The present invention shall not be limited to the above-mentioned embodiments, and may allow various modifications without departing from the main scope of the invention. For example, in addition to providing the underlying resin of the bump electrodes on part of the active surface 121a of the electronic component 121, the underlying resin may be provided to cover approximately the entire active surface 121a, except for areas corresponding to the electrode terminals. This enables to enlarge the area in which the conductive films substantially function as electrodes on the underlying resin, thereby improving the reliability of electric connection with the terminals 11. Moreover, the underlying resin obtains an increased (larger) area that is not covered by the conductive films. This allows increasing the size of the area that directly adheres to the substrate, thereby improving the strength in mounting the electronic component 121 to the substrate 111.

Figure 14:
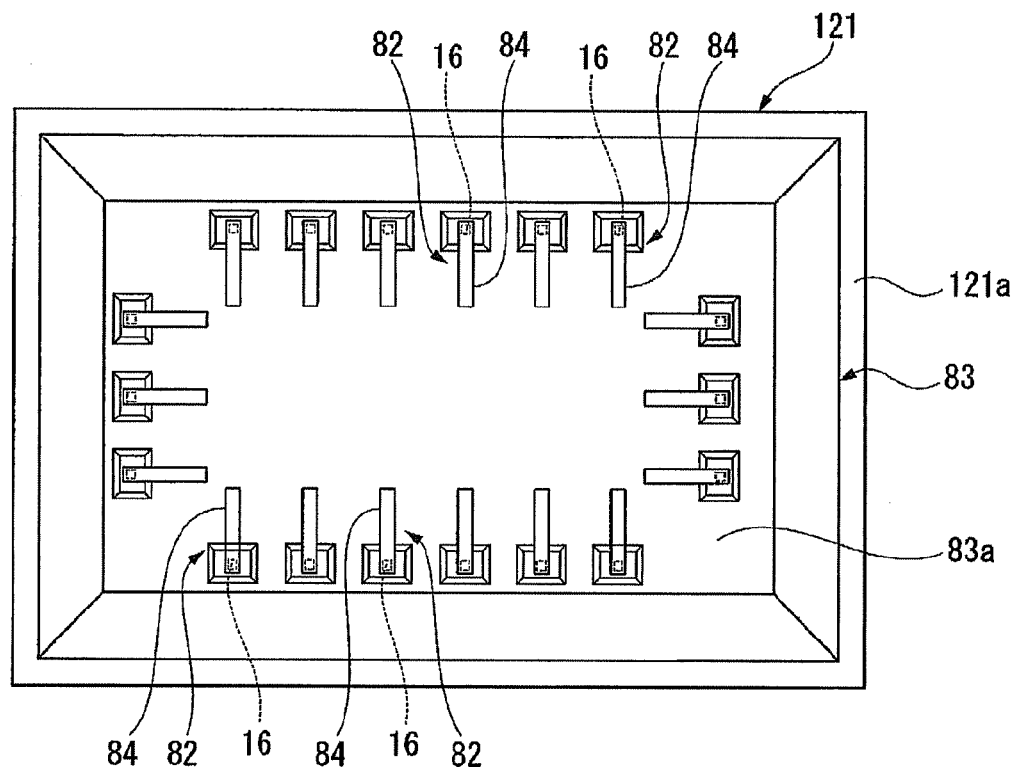
FIG. 14 is an explanatory drawing of a modification of the mounting structure according to an aspect of the invention.

Further, as shown in FIG. 14, if the underlying resin is formed so as to cover approximately the entire active surface 121a, multiple openings 83b may be formed in underlying resin 83, and conductive films 84 may be formed so as to be electrically continued to the electrode terminals 16 exposed inside these openings 83b. Here, the underlying resin 83 still have wide (large) area not covered by the conductive films 84. This allows increasing the size of the area that directly adheres to the substrate, thereby improving the strength in mounting the electronic component 121 to the substrate. This embodiment of forming the underlying resin so as to cover approximately the entire active surface 121a becomes more effective when applied to electronic components such as, in particular, semiconductor devices that have electrodes along either two sides, four sides, or on the entire surface.

Moreover, instead of the substrate made of glass and synthesized resin, various kinds of substrates may be used for the substrate 111 such as a rigid substrate, a silicon substrate, and a thin ceramics substrate. Examples of the electronic component includes, in addition to an IC chip for liquid crystal drive, any electronic component that has the connecting electrode (bump electrode) described above, including various integrated circuits and passive components such as diodes, transistors, light-emitting diode, laser diode, oscillator, and capacitors.

Examples of devices in which the mounting structure of the electronic component according to an aspect of the invention is applied include, in addition to the liquid crystal display device described above, an organic electroluminescence device (organic EL device), a plasma display device, an electrophoretic display device, and devices utilizing electroemissive elements (such as field emission display and surface-conduction electron-emitter display). These devices may be applied to various electro-optical devices and electronic modules.

What is claimed is:

1. A mounting structure of an electronic component, comprising:
    a substrate having a conductive terminal and the electronic component which is mounted on the substrate;
        an underlying resin provided on an active surface of the electronic component; and
        a conductive film covering a part of a surface of the underlying resin and exposing the rest, so as to be electrically continued to an electrode terminal;
    wherein:
        the conductive film makes direct conductive contact with the conductive terminal;
        the underlying resin is elastically deformable so that at least a part of an exposed area which is exposed without being covered by the conductive film directly adheres to the substrate; and
        the substrate and the electronic component retain a state of the conductive film making conductive contact with the conductive terminal by adhesivity of the exposed area of the underlying resin to the substrate.

2. The mounting structure of an electronic component according to claim 1, wherein:
    the conductive film and the conductive terminal are provided in plurality so as to include at least two conductive films and at least two conductive terminals, each of the at least two conductive films corresponding to one of the at least two conductive terminals so as to be conductively contacted together;
    the at least two conductive films each have a contacting area with a different height so as to be conductively contacted to the at least two conductive terminals; and the at least two conductive films are conductively contacted to the at least two conductive terminals in a state in which a height fluctuation of the contacting area is absorbed by the underlying resin elastically deforming in proportion with the height of the contacting area.

3. The mounting structure of an electronic component according to claim 1, wherein: the underlying resin is shaped as a barrel vault with a transverse sectional surface of one of approximately a half circle, approximately a half oval, and approximately a trapezoid; and the conductive film is provided in a belt-like shape on a part of a top surface of the underlying resin along a direction of the transverse sectional surface.

4. The mounting structure of an electronic component according to claim 1, wherein the electrode terminal is installed on the electronic component, and the underlying resin is formed to surround the electronic component.

5. The mounting structure of an electronic component according to claim 4, wherein the conductive film is electrically continued to the electrode terminal, and is provided in an inner area on the underlying resin in a state of surrounding the electrode terminal.

6. The mounting structure of an electronic component according to claim 5, wherein the conductive film includes an area covering the underlying resin being formed with a plurality of extending pieces extending radially with the electrode terminal as a center.

7. The mounting structure of an electronic component according to claim 4, wherein the underlying resin is provided so as to cover approximately an entire active surface of the electronic component, except for an area that corresponds to the electrode terminal.

8. The mounting structure of an electronic component according to claim 1, wherein the electronic component is a quartz crystal resonator.

9. The mounting structure of an electronic component according to claim 1, wherein the electronic component is a semiconductor device.

* * * * *